United States Patent [19]

Scagnelli

[11] 4,167,032
[45] Sep. 4, 1979

[54] ALIGNMENT APPARATUS FOR CIRCUIT CARD MOUNTINGS

[75] Inventor: Henry J. Scagnelli, Upper Montclair, N.J.

[73] Assignee: Bell Telephone Laboratories, Incorporated, Murray Hill, N.J.

[21] Appl. No.: 906,257

[22] Filed: May 15, 1978

[51] Int. Cl.² .................................................. H02B 1/02
[52] U.S. Cl. ..................................................... 361/415
[58] Field of Search .............................. 361/413, 415; 339/184 M, 186 M; 211/41

[56] References Cited

U.S. PATENT DOCUMENTS

| | | | |
|---|---|---|---|
| T876004 | 7/1970 | Andreini et al. | 339/45 |
| 3,008,113 | 11/1961 | Johnson | 361/415 |
| 3,320,483 | 5/1967 | Pohl | 361/415 |
| 3,599,234 | 8/1971 | Andreini et al. | 361/415 |
| 3,671,811 | 6/1972 | Ezaki | 361/407 |
| 3,963,301 | 6/1976 | Stark | 339/186 M |

FOREIGN PATENT DOCUMENTS 230972 10/1964 Austria ....................................... 361/415

Primary Examiner—David Smith, Jr.
Attorney, Agent, or Firm—John W. Fisher

[57] ABSTRACT

Apparatus (120, 121, 410, 640) is disclosed for facilitating the alignment of an electrical circuit card (109) having an edge-mounted connector (501) thereon with a plurality of backplane-mounted electrical pin contacts (114) in a circuit card mounting assembly (101). Insulative aligners (120, 121) engage a number of the backplane pin contacts (114) in one or more linear arrays of such contacts along top and bottom edges of the assembly (101). Projecting from these aligners (120, 121) are a plurality of alignment dowels (330) which mate with corresponding apertures (414) in a guide ramp (410). The guide ramp (410) accurately positions the edge-mounted connector (501) on an inserted circuit card (109) for engagement with one or more of the linear arrays of contacts (114) in the backplane (113).

10 Claims, 8 Drawing Figures

ALIGNMENT APPARATUS FOR CIRCUIT CARD MOUNTINGS

BACKGROUND OF THE INVENTION

1. Technical Field of the Invention

This application relates to electric circuit card mounting apparatus and, in particular, to apparatus for facilitating the alignment of electrical circuit cards with a plurality of backplane-mounted pin contacts.

2. Description of the Prior Art

Present systems employed for mounting circuit cards require rather close tolerances on the assembled parts of the mounting apparatus to assure proper alignment of the circuit card edge-mounted connector with a field of contacts in the backplane. In some instances, as exemplified by K. H. Pohl, U.S. Pat. No. 3,320,483 issued May 16, 1967, support members have been disclosed for card-edge type connectors. In Pohl the support member comprises an elongated holder body with a pair of tongues molded at the top and bottom. These tongues snap-mount around mating bosses provided on the carrier or frame. An inner chamber of each holder formed by the side and front walls includes a number of wedge-shaped lips through which the connector block may be forced and, once behind them, retained. Extension of either or both of the sidewalls of the holder provides protection for the connector block terminals.

Another example of circuit card mounting apparatus is disclosed in J. Andreini et al, U.S. Pat. No. 3,559,234, issued Aug. 10, 1971. This reference relates to a receptacle for modular circuit elements. The receptacle includes spaced sides having opposed grooves, each side having a plurality of spaced, parallel struts extending rearward of the grooves. The grooves accommodate lateral edges of the circuit card to guide it into engagement with the connector extending between the sides. Each end of the connector has a pair of tines that are accommodated by the spaces between the struts. The tines at one end of the connector include lips that extend behind the struts and secure the connector in place.

Similar apparatus is disclosed in J. Andreini et al Defensive Publication No. T876,004, published July 28, 1970. While the Andreini et al defensive publication is primarily directed to apparatus for locking a circuit card to a mounting, a slotted card guidance arrangement is suggested.

Although each of the foregoing references discloses a practical solution to the particular problem faced, the problem of requiring close tolerances on each of the pieceparts used to fabricate circuit card mounting assemblies persists. In particular, the problem of ensuring accurate alignment of a circuit card edge-mounted connector with several hundred pin contacts mounted in a backplane without the need for very close tolerances of the assembled pieceparts remains a constant source of concern to physical designers. Efforts to alleviate this problem dictate that a circuit card mounting assembly be devised which provides for ease of card insertion while ensuring accurate alignment. An assembly to facilitate card mounting in this fashion should be modular in design and mass producible at low cost. Moreover, there should be a relatively high degree of compatability and interchangeability among the various assembly pieceparts.

SUMMARY OF THE INVENTION

The foregoing problems are overcome in an illustrative embodiment of apparatus for facilitating the alignment of an electrical circuit card having an edge-mounted connector thereon with a plurality of electrical pin contacts in a circuit card mounting assembly. The mounting assembly includes a backplane which has affixed thereto a plurality of pin contacts aligned in at least one linear array. Further included is a device for engaging selected edges ones of the aligned pin contacts along top and bottom edges of the mounting assembly. Apparatus for accurately guiding the circuit card into engagement with the linear array of pin contacts is also included. To ensure proper alignment of the circuit card with the array of pin contacts, the engaging device has integral therewith a plurality of projections which accurately align the guiding apparatus to it.

Accordingly, it is an advantage of one embodiment of the present invention that a circuit card mounting assembly to facilitate accurate alignment of an edge-mounted circuit card connector with a plurality of backplane mounted pin contacts is modular in design and mass producible at low cost. Alignment accuracy is obtained by virtue of each alignment element being keyed to the pin contacts, the very elements with which alignment is sought.

Another advantage of one embodiment is that the individual pieceparts used to fabricate the apparatus mounting can be advantageously manufactured with modest tolerances. These pieceparts have a relatively high degree of compatibility and interchangeability.

Still further advantages of an embodiment of this invention are that a range of circuit card sizes and interconnection densities can be advantageously provided to match a variety of system packaging needs. These needs extend from low density, high manufacturing volume circuits up to very high density circuits.

BRIEF DESCRIPTION OF THE DRAWINGS

The aforementioned advantages of the invention, as well as other advantages, will be better understood upon consideration of the following detailed description and appended claims taken in conjunction with the attached drawings of an illustrative embodiment in which:

DETAILED DESCRIPTION

Figure 1:
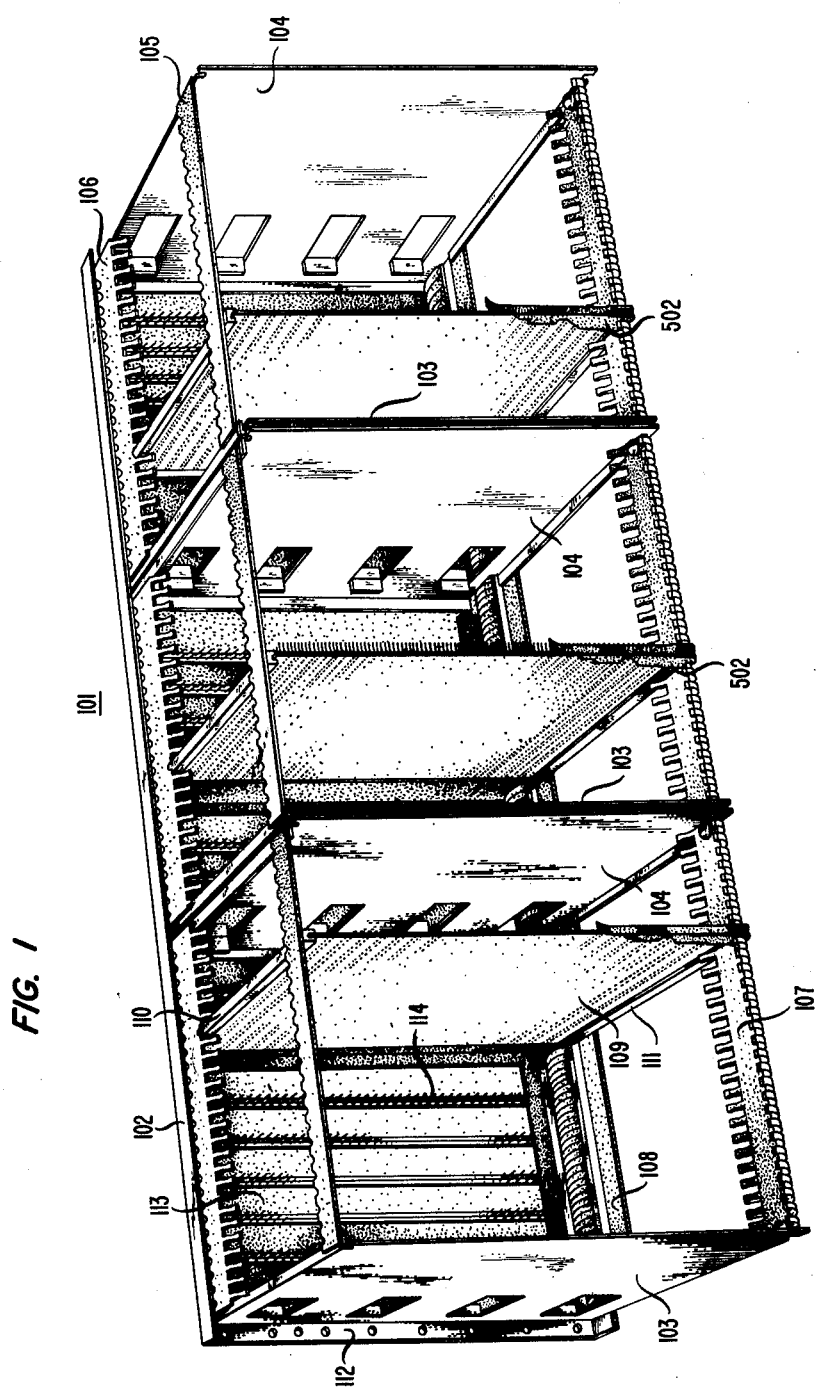
FIG. 1 is an overall perspective view of a modular circuit card mounting assembly.

A three-module apparatus housing 101 is shown in FIG. 1. Each module of housing 101 is comprised of a backplane assembly 102 and end plates 103 and 104. When two or more modules are stacked adjacent to one another, end plate 103 of one module is brought into close proximity with end plate 104 of the adjacent module. In the preferred embodiment, end plates 103 and 104 are stamped metal parts.

Figure 2:
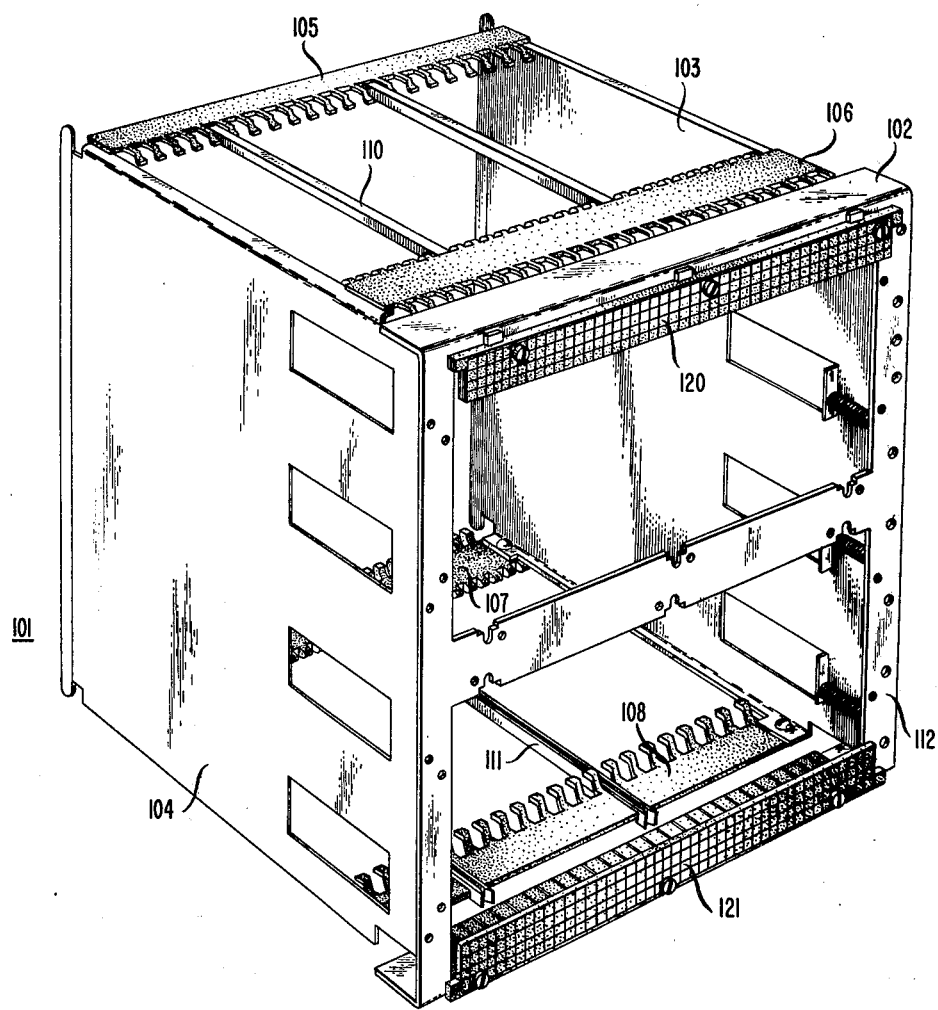
FIG. 2 is a perspective view of the back of a single module illustrating a portion of the backplane assembly.

To provide structural support and to aid in board alignment, end plates 103 and 104 are held in a spaced-apart relationship, as shown in FIG. 2, by a plurality of cross supports 105 through 108. In particular, at the top of housing 101 there is a front cross support 105 and a rear cross support 106. Correspondingly, at the bottom of housing 101 there is a front cross support 107 and a rear cross support 108. To further aid in the alignment of circuit packs or cards 109 as they are inserted into and mounted in housing 101, card guides 110 and 111 are straddlingly positioned between cross supports 105 and 106 and cross supports 107 and 108. Card guides 110 and 111 snap into slots located approximately 0.25 inch on center in the cross supports 105 through 108. In the preferred embodiment, card guides 110 and 111 are molded of a 10 percent glass-filled polycarbonate.

Backplane assembly 102 provides electrical interconnection and mechanical alignment of circuit packs 109. Assembly 102 has as its heart a backplane mounting plate 112, shown most clearly in FIG. 2. Mounting plate 112 mechanically unites apparatus housing 101 on a shelf (not shown) and provides a means for frame mounting of the housing 101. In addition to providing mechanical support, mounting plate 112 provides a mechanical structure for affixing backplane 113, shown in FIG. 1, to apparatus housing 101.

Backplane 113 typically is an epoxy glass board having a plurality of drilled holes or plated-through holes therein for accepting a corresponding plurality of electrical pin contacts 114. However, many other types of backplanes can be used advantageously. In particular, epoxy-clad metal boards, multilayer boards, insulative boards having conductive patterns laminated thereto and the like have been found to be suitable.

Pin contacts 114 when inserted into the holes in backplane 113 can be advantageously held in place by either reflow solder techniques or by frictional engagement between the barrel of the holes and a compliant midsection of pin contacts 114. Frictional engagement is preferred. Pin contacts 114 are double-ended contacts, one side of which extends inwardly into apparatus housing 101 to permit electrical engagement with circuit packs 109. An oppositely extending projection extends outwardly from the backplane and is used for electrical interconnection among the various circuit packs 109 mounted in apparatus housing 101 or other circuit packs 109 mounted in adjacent housings 101. In the preferred embodiment pin contacts 114 are comprised of a square pin of approximately 0.025 inch on a side. Pin contacts 114 are designed to allow three wire-wrapped levels or two wire-wrapped levels and one backplane connector engagement on the wiring side of backplane 113. On the circuit pack side they are designed typically to protrude about 0.650 inch and about 0.700 inch above backplane 113 to allow an early-make/late-make capability.

Figure 5:
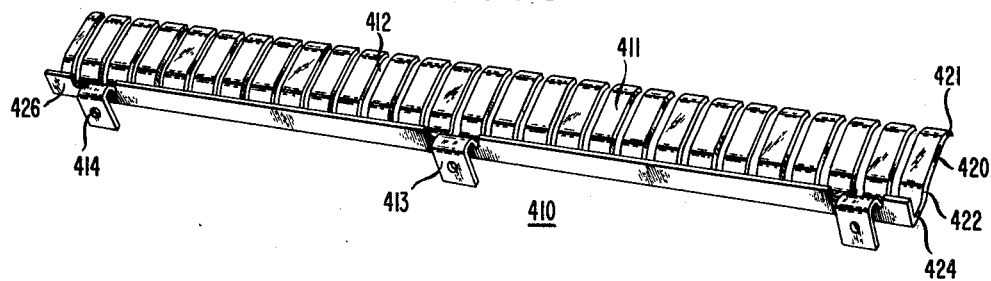
FIG. 5 is a perspective view of the guide ramp.
Figure 3:
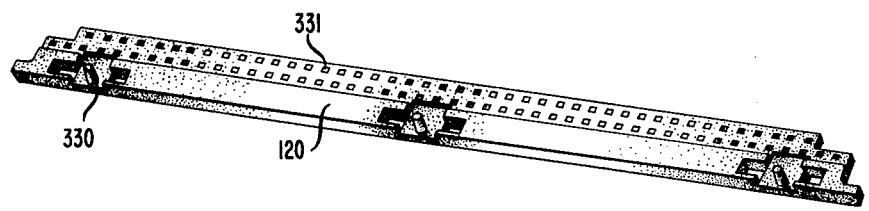
FIG. 3 is a rear perspective view of the insulative aligner.
Figure 4:
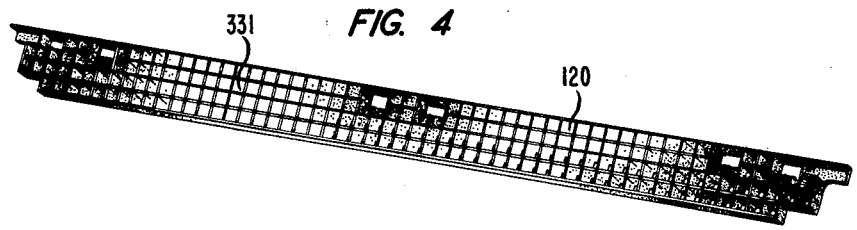
FIG. 4 is a front perspective view of the insulative aligner.
Figure 6:
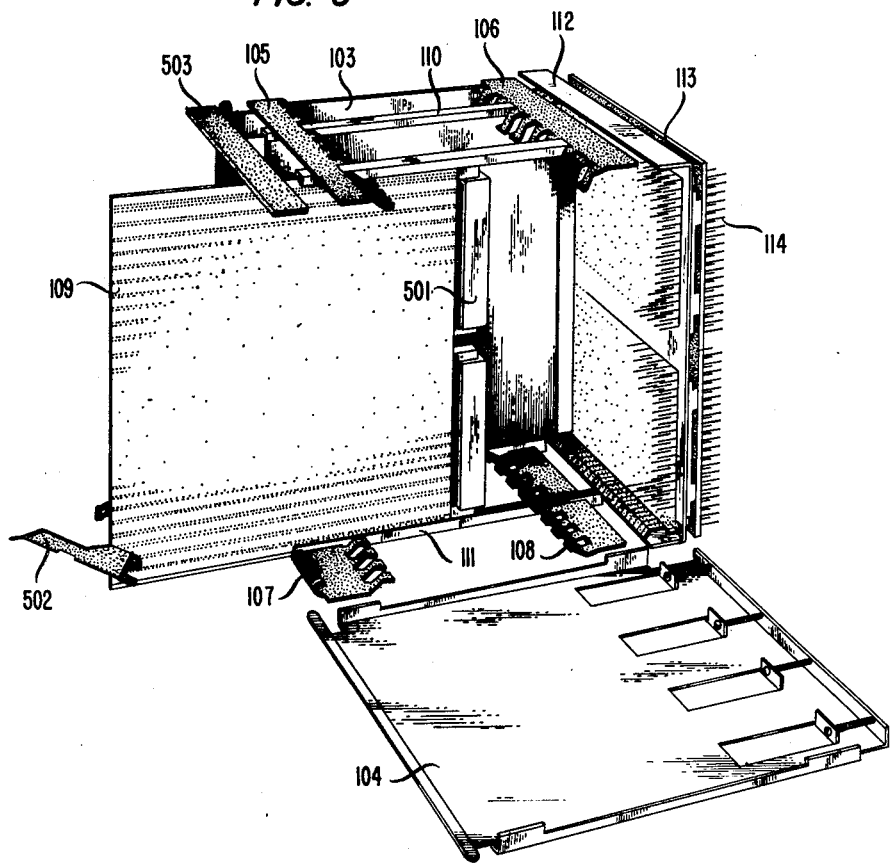
FIG. 6 is a partially exploded view of an individual circuit card mounting module illustrating board insertion.

To facilitate the alignment of circuit pack 109 having an edge-mounted connector 501 thereon, as shown most clearly in FIG. 6, with a plurality of backplane-mounted pin contacts 114, there is interposed between the top and bottom of backplane 113 and backplane mounting plate 112 insulative aligners 120 and 121, one of which is shown in rear and front perspective views in FIGS. 3 and 4. Insulative aligners 120 and 121 space backplane 113 an appropriate distance from mounting plate 112, insulate backplane 113 from mounting plate 112, and provide means for aligning a card ramp 410, shown in FIG. 5, relative to backplane 113. Each of insulative aligners 120 and 121 engages a number of pin contacts 114 in backplane 113 along the top and bottom edges of apparatus housing 101.

Insulative aligners 120 and 121 are comprised of a generally elongated strip of insulative material which has integral therewith a plurality of spaced-apart alignment dowels 330. The purpose for alignment dowels 330 will become evident subsequently. Included along the length of aligners 120 and 121 are a multiplicity of pin contact alignment apertures 331. Apertures 331 are spaced apart by a distance which is approximately equal to the spacing between one or more linear arrays of pin contacts 114 affixed to backplane 113. Consequently, the spacing between adjacent ones of the spaced-apart apertures 331 is in one-to-one correspondence with the spacing between adjacent ones of the pin contacts 114 on backplane 113. Apertures 331 ensure the accurate placement of aligners 120 and 121 with respect to selected ones of pin contacts 114 in backplane 113. Even though each aperture is loose fitting, the multiplicity of apertures 331 engaging pin contacts 114 ensures the accurate alignment sought.

As indicated previously, insulative aligners 120 and 121 have integral therewith a plurality of alignment dowels 330. Dowels 330 ensure the accurate placement of guide 410 in apparatus housing 101. Guide 410 in turn further ensures the accurate alignment of circuit packs 109 relative to backplane pin contacts 114. Both horizontal and vertical guidance are provided.

Guide 410, as shown in FIG. 5, is comprised of a generally elongated member of structural material having integral therewith a plurality of spaced-apart teeth 411. Teeth 411 are spaced apart from one another by a distance just slightly larger than a thickness of guide tab 640 on connector 501. This spacing between teeth 411 provides ramped guide slots 412 for engaging one or more of guide tabs 640, which are shown most clearly in FIG. 7. Teeth 411 are comprised of a generally flat intermediate region 420 and oppositely directed angular edge portions 421 and 422. Angular edge portion 421 extends away from intermediate region 420 with a first slope whereas angular edge portion 422 extends away from intermediate region 420 with a second slope. The second slope is oppositely directed to that of the first slope. At the free end of angular portion 421, there are tapered entryways. It should be noted that by virtue of this configuration teeth 411 serve as cantilevered springs to advantageously provide vertical alignment as well as horizontal alignment. The tapered entryways further aid in guiding circuit card 109 into guide slots 412.

Also integral with guide ramp 410 are a plurality of alignment tabs 413 each of which has an aperture 414 therein. These apertured tabs provide proper alignment between guide ramp 410 and the alignment dowels 330 in insulative aligners 120 and 121.

Tabs 413 are integral with a common support strip which interconnects all of spaced-apart teeth 411. The support strip comprises a generally L-shaped member having a base region 424 which couples to angular edge portion 422 in teeth 411. Base region 424 lies in a plane parallel with a plane containing intermediate region 420. An upward arm 426 of the L-shaped support strip, has alignment tabs 413 integral therewith and lies in a plane generally perpendicular to a plane containing base region 424. Alignment tabs 413 are perpendicular to base region 424 and parallel with upward arm 426.

Figure 7:
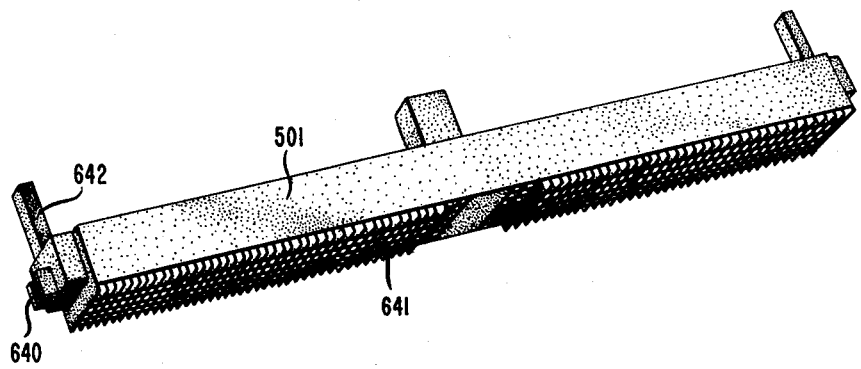
FIG. 7 is a perspective view of the multicontact, edge-mounted connector.
Figure 8:
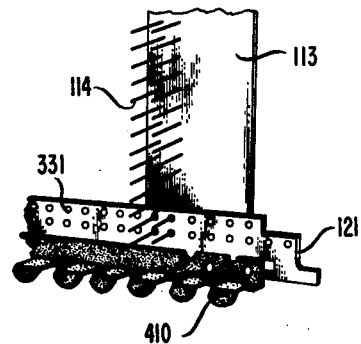
FIG. 8 is a partial perspective view of a portion of the backplane assembly illustrating the alignment of the insulative aligner with a number of the backplane-mounted pin contacts and the further alignment of the guide ramp with the insulative aligner.

The interengagement among pin contacts 114 affixed to backplane 113, insulative aligner 120, and guide ramp 410 is shown most clearly in FIG. 8. In this partial perspective view, a number of pin contact alignment apertures 331 in insulative aligner 121 engage a number of pin contacts 114. This engagement ensures proper alignment between insulative aligner 121 and the array of backplane mounted pin contacts 114. Furthermore, by virtue of the alignment dowels 330 in aligner 221 and the alignment tabs 413 in guide ramp 410, guide ramp 410 is precisely aligned relative to pin contacts 114. Hence, upon the insertion of circuit pack 109 into apparatus housing 101, as shown most clearly in FIG. 6, guide tabs 640 on edge-mounted connector 501 are accurately aligned in guide tab slots 412 of guide ramp 410. As a result contact apertures 641 in connector 501, as shown in FIG. 7, are properly aligned with pin contacts 114 in backplane 113. It should be noted that connector 501 is provided with a plurality of connector mounting tabs 642 to allow mechanical connection of connector 501 to circuit pack 109.

In addition to illustrating the insertion of a circuit pack 109 into apparatus housing 101, FIG. 6 further illustrates a latch 502 for holding circuit packs 109 in place in apparatus housing 101. Latch 502 serves as an insertion and extraction lever as well as a positive locking device and an insertion stop. A simple, reliable cost-effective spring lock is provided with each latch 502. The design is such that it can be advantageously implemented in such a way that the parts are produced economically by metal stamping. On the front of apparatus housing 101 there is a hingedly-mounted faceplate 503. Faceplate 503 is so designed that any number of circuit pack identifiers may be affixed thereto or inscribed thereon.

In all cases it is to be understood that the above described embodiment is illustrative of but a small number of many possible specific embodiments which can represent applications of the principles of the invention. Thus, numerous and various other embodiments can be devised readily in accordance with these principles by those skilled in the art without departing from the spirit and scope of the invention.

I claim:

1. Apparatus for facilitating the alignment of an electrical circuit card having an edge-mounted connector thereon with a plurality of electrical pin contacts in a circuit card mounting assembly, said assembly including a backplane having affixed thereto said plurality of pin contacts aligned in at least one linear array, the apparatus including:
   means, in planar alignment with top and bottom edges of said backplane, for engaging selected edge ones of said aligned pin contacts along a top and bottom of said mounting assembly;
   means, in linear alignment with said engaging means and said top and bottom edges of said backplane, for guiding both horizontally and vertically said circuit card into engagement with a linear array of pin contacts which are perpendicularly oriented with respect to said selected edge ones of said aligned pin contacts coupled to said engaging means; and
   means, integral with said engaging means, for aligning said guiding means with said aligned pin contacts coupled to said engaging means so that said circuit card edge-mounted connector is keyed in alignment to said linear array of perpendicularly oriented pin contacts through said guiding means and said engaging means.

2. The apparatus in accordance with claim 1 wherein said engaging means comprises:
   an elongated member of insulative material, said member having integral therewith a plurality of spaced-apart apertures for engaging said selected ones of said backplane-mounted pin contacts; and
   a plurality of spaced-apart dowels, integral with said elongated member, for aligning said member with said guiding means.

3. The apparatus is accordance with claim 2 wherein the spacing between adjacent ones of said spaced-apart apertures in said elongated member is in one-to-one correspondence with the spacing between adjacent ones of said pin contacts on said backplane.

4. The apparatus in accordance with claim 2 wherein said guiding means comprises:
   a generally elongated member of structural material, said member having integral therewith a plurality of spaced-apart teeth, adjacent ones of said teeth being spaced apart from one another by a distance just slightly larger than a thickness of a guide tab integral with an edge-mounted circuit card connector; and
   a plurality of spaced-apart alignment tabs integral with said elongated member, each of said tabs having an aperture therein for interengaging with said dowels to ensure proper alignment between said guiding means and said engaging means.

5. The apparatus in accordance with claim 4 wherein each of said spaced-apart teeth comprises:
   a generally flat intermediate region;
   a first edge portion angularly directed away from said intermediate region with a first slope, said edge portion terminating in a tapered entryway;
   a second edge portion angularly directed away from said intermediate region with a second slope, said second slope being oppositely directed from that of said first slope; and
   a common support strip coupling each of said second edge portions of said spaced-apart teeth to said plurality of spaced-apart alignment tabs.

6. The apparatus in accordance with claim 5 wherein said common support strip comprises:
   a generally L-shaped member having a base region lying in a plane parallel with a plane containing said spaced-apart teeth intermediate region, said plurality of spaced-apart teeth being integral with said base region; and
   an upwardly directed arm lying in a plane which is generally perpendicular to a plane containing said base region, said arm coupling said spaced-apart alignment tabs to one another.

7. The apparatus in accordance with claim 6 wherein said alignment tabs are perpendicular to said base region of said L-shaped member and parallel with said upwardly directed arm of said member.

8. Apparatus for facilitating the alignment of an electrical circuit card having an edge-mounted connector thereon with a plurality of electrical pin contacts in a circuit card mounting assembly, said assembly including a backplane having affixed thereto said plurality of pin contacts aligned in at least one linear array, the apparatus including:

- an elongated member of insulative material, said member being positioned in planar alignment with top and bottom edges of said backplane and having integral therewith a plurality of spaced-apart apertures for engaging selected edge ones of said aligned pin contacts along a top and bottom of said mounting assembly, the spacing between adjacent ones of said spaced-apart apertures being in one-to-one correspondence with the spacing between adjacent ones of said pin contacts in said backplane;
- a plurality of spaced-apart dowels integral with said elongated member;
- a generally elongated member of structural material, said generally elongated member being positioned in linear alignment with said insulative elongated member and with said top and bottom edges of said backplane, said generally elongated member having integral therewith a plurality of spaced-apart teeth, adjacent ones of which are spaced apart from one another by a distance just slightly larger than a thickness of a guide tab integral with said edge-mounted circuit card connector, said spaced-apart teeth acting as cantilevered springs for guiding said circuit card both horizontally and vertically into engagement with a linear array of pin contacts which are perpendicularly oriented with respect to said selected edge ones of said aligned pin contacts coupled to said insulative elongated member; and
- a plurality of spaced-apart alignment tabs integral with said generally elongated member, each of said tabs having an aperture therein for interengaging with said spaced-apart dowels such that said generally elongated member is aligned with said insulative elongated member and with said aligned pin contacts coupled to said insulative elongated member so that said circuit card edge-mounted connector is keyed in alignment to said linear array of perpendicularly oriented pin contacts through said generally elongated member and said insulative elongated member.

9. The apparatus in accordance with claim 8 wherein each of said spaced-apart teeth comprises:

- a generally flat intermediate region;
- a first edge portion angularly directed away from said intermediate region with a first slope, said edge portion terminating in a tapered entryway for facilitating engagement with said guide tab integral with said edge-mounted circuit card connector;
- a second edge portion angularly directed away from said intermediate region with a second slope, said second slope being oppositely directed from that of said first slope; and
- a common support strip coupling each of said second edge portions of said spaced-apart teeth to said plurality of spaced-apart alignment tabs.

10. The apparatus in accordance with claim 9 wherein said common support strip comprises:

- a generally L-shaped member having a base region lying in a plane parallel with a plane containing said spaced-apart teeth intermediate region, said plurality of spaced-apart teeth being integral with said base region; and
- an upwardly directed arm lying in a plane which is generally perpendicular to a plane containing said base region, said arm coupling said spaced-apart alignment tabs to one another.

* * * * *